United States Patent
Booth et al.

(10) Patent No.: US 8,862,952 B1
(45) Date of Patent: Oct. 14, 2014

(54) PRIORITIZED MEMORY SCANNING FOR DATA STORAGE SYSTEMS

(75) Inventors: Jing Booth, San Jose, CA (US); Andrew J. Tomlin, San Jose, CA (US)

(73) Assignee: Western Digital Technologies, Inc., Irvine, CA (US)

(*) Notice: Subject to any disclaimer, the term of this patent is extended or adjusted under 35 U.S.C. 154(b) by 227 days.

(21) Appl. No.: 13/422,509

(22) Filed: Mar. 16, 2012

(51) Int. Cl.
| | |
|---|---|
| G11C 29/00 | (2006.01) |
| G06F 11/00 | (2006.01) |
| G06F 12/00 | (2006.01) |
| G06F 11/10 | (2006.01) |
| G11C 16/34 | (2006.01) |
| G06F 12/02 | (2006.01) |
| G11C 13/00 | (2006.01) |
| G11C 29/52 | (2006.01) |

(52) U.S. Cl.
CPC .......... *G06F 11/1068* (2013.01); *G11C 16/349* (2013.01); *G11C 16/3468* (2013.01); *G11C 16/344* (2013.01); *G06F 12/0246* (2013.01); *G11C 16/3463* (2013.01); *G11C 16/3404* (2013.01); *G11C 13/0035* (2013.01); *G06F 11/106* (2013.01); *G06F 2212/7211* (2013.01); *G11C 29/52* (2013.01)
USPC ........... 714/718; 714/719; 714/723; 714/763; 714/768; 714/773; 714/799; 711/103; 711/104; 711/105

(58) Field of Classification Search
CPC . G06F 3/0689; G06F 11/106; G06F 11/1068; G06F 12/0246; G06F 2212/7211; G11C 13/0035; G11C 16/349; G11C 16/3404; G11C 16/344; G11C 16/3463; G11C 16/3468; G11C 29/52

USPC ......... 714/763, 718, 719, 723, 768, 773, 799; 711/103, 104, 105
See application file for complete search history.

(56) References Cited

U.S. PATENT DOCUMENTS

| | | | | |
|---|---|---|---|---|
| 3,824,558 | A * | 7/1974 | Koshiba | 714/46 |
| 6,058,047 | A * | 5/2000 | Kikuchi | 365/185.33 |
| 6,831,865 | B2 * | 12/2004 | Chang et al. | 365/185.33 |
| 7,167,399 | B2 * | 1/2007 | Wooldridge | 365/185.29 |
| 7,308,605 | B2 * | 12/2007 | Jardine et al. | 714/11 |
| 7,865,761 | B1 * | 1/2011 | Chilton | 714/2 |
| 8,255,762 | B2 * | 8/2012 | Nagadomi et al. | 714/754 |
| 8,261,136 | B2 * | 9/2012 | D'Abreu et al. | 714/708 |
| 8,291,295 | B2 * | 10/2012 | Harari et al. | 714/763 |
| 8,356,216 | B2 * | 1/2013 | Radke et al. | 714/718 |
| 8,453,021 | B2 * | 5/2013 | Moshayedi et al. | 714/710 |
| 8,458,537 | B2 * | 6/2013 | Komai | 714/718 |
| 8,479,061 | B2 * | 7/2013 | Sartore | 714/723 |
| 8,516,341 | B2 * | 8/2013 | Kim et al. | 714/769 |
| 8,522,091 | B1 * | 8/2013 | White et al. | 714/725 |
| 2010/0023800 | A1 | 1/2010 | Harari et al. | |
| 2010/0332943 | A1 | 12/2010 | D'Abreu et al. | |
| 2012/0047316 | A1 * | 2/2012 | Post et al. | 711/103 |

* cited by examiner

Primary Examiner — John J Tabone, Jr.

(57) ABSTRACT

A data storage system configured to perform prioritized memory scanning for memory errors is disclosed. In one embodiment, the data storage system prioritizes scanning for memory errors based on a quality attribute of pages or zones of a non-volatile memory array. Pages or zones having quality attributes that reflect a lower level of reliability or endurance than other pages or zones are scanned more frequently for memory errors. When memory errors are discovered, the quality attribute of pages or zones can be adjusted to reflect a lower level of reliability or endurance. In addition, stored data can be recovered before it may become permanently lost and before a host system reads the stored data. Improved performance of the data storage system is thereby attained.

20 Claims, 6 Drawing Sheets

| Page Number | Raw Bit Errors @ 5K P/E Cycles | Raw Bit Errors @ 15K P/E Cycles | Raw Bit Errors @ 25K P/E Cycles |
|---|---|---|---|
| 0 | 0 | 0 | 13 |
| 1 | 0 | 0 | 32 |
| 2 | 0 | 0 | 11 |
| 3 | 0 | 0 | 14 |
| 4 | 0 | 0 | 5 |
| 5 | 0 | 0 | 3 |
| 8 | 0 | 0 | 4 |
| 9 | 0 | 0 | 2 |
| 122 | 0 | 1 | 49 |
| 123 | 0 | 3 | 68 |
| 126 | 0 | 3 | 50 |
| 127 | 0 | 2 | 81 |
| 128 | 1 | 0 | 5 |
| 129 | 1 | 2 | 4 |
| 132 | 0 | 0 | 4 |
| 133 | 0 | 0 | 3 |
| 246 | 0 | 6 | 265 |
| 247 | 0 | 12 | 456 |
| 250 | 0 | 31 | 492 |
| 251 | 0 | 13 | 244 |
| 252 | 0 | 0 | 21 |
| 253 | 0 | 0 | 18 |
| 254 | 0 | 11 | 398 |
| 255 | 0 | 10 | 133 |

PRIORITIZED MEMORY SCANNING FOR DATA STORAGE SYSTEMS

BACKGROUND

1. Technical Field

This disclosure relates to data storage systems, such as solid state drives, for computer systems. More particularly, the disclosure relates to prioritizing the performance of memory scans in data storage systems.

2. Description of the Related Art

Non-volatile memory arrays may contain defective locations, such as pages with uncorrectable error-correcting code (ECC) errors or correctable ECC errors with high raw bit errors. The defects may develop in connection with manufacturing of the memory arrays or during usage of the memory arrays. For example, as memory arrays are used over time, such as when memory arrays are subjected to a greater number of program-erase cycles, pages of memory are more likely to experience or produce memory errors in connection with storing data. If memory errors remain unaddressed, the memory errors can result in a loss of stored data.

Memory errors preferably are discovered before the memory errors result in the loss of data. However, memory errors are difficult to locate and require significant processing time to discover. Accordingly, improved devices and methods for discovering memory errors are desired.

BRIEF DESCRIPTION OF THE DRAWINGS

Systems and methods that embody the various features of the invention will now be described with reference to the following drawings, in which.

DETAILED DESCRIPTION OF SPECIFIC EMBODIMENTS

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

As the capacity of non-volatile memory arrays increases, the process of scanning non-volatile memory arrays for memory errors becomes more time consuming and resource-intensive. Pages of non-volatile memory arrays may be scanned individually and sequentially to locate memory errors, so it may not be possible to quickly scan every page of non-volatile memory arrays or provide an on-demand scan of certain pages. Furthermore, as non-volatile memory arrays are designed to sustain higher program-erase cycle levels, the need increases to locate memory errors before the errors result in a loss of data. Accordingly, a simple sequential scan of pages of memory in non-volatile memory arrays may be insufficient.

In some embodiments of the present invention, a controller is configured to perform a prioritized scan of pages of a non-volatile memory array for memory errors, such as raw bit errors. The scan can be prioritized so that some pages that are likely to have a lower level of reliability or endurance are scanned more frequently than other pages that are likely to have a higher level of reliability or endurance. For example, since pages of memory closer to a block boundary tend to have a lower level of reliability or endurance especially at higher program-erase cycle levels, pages located closer to a block boundary than other pages in the block are scanned more frequently for memory errors.

In some embodiments of the present invention, a controller prioritizes a scan for memory errors based on a quality attribute. Certain pages in a block that are likely to have a similar level or reliability or endurance can be grouped into a zone. For example, pages located closer to a block boundary can be grouped into a zone. The quality attribute can be a multi-bit value indicative of a level of reliability or endurance of pages and/or zones. Zones with a higher quality attribute (which may indicate lower reliability or endurance) can be scanned more frequently than other zones with a lower quality attribute (which may indicate high reliability or endurance). The prioritized scan for memory errors can utilize a weighted round robin scheduling so that zones that are likely to be less reliable or have lower endurance are scanned more frequently than other zones, while ensuring that all zones are eventually scanned. Further, in one embodiment, the controller performs a triggered scan based on environmental conditions of a non-volatile memory array.

System Overview

Figure 1:
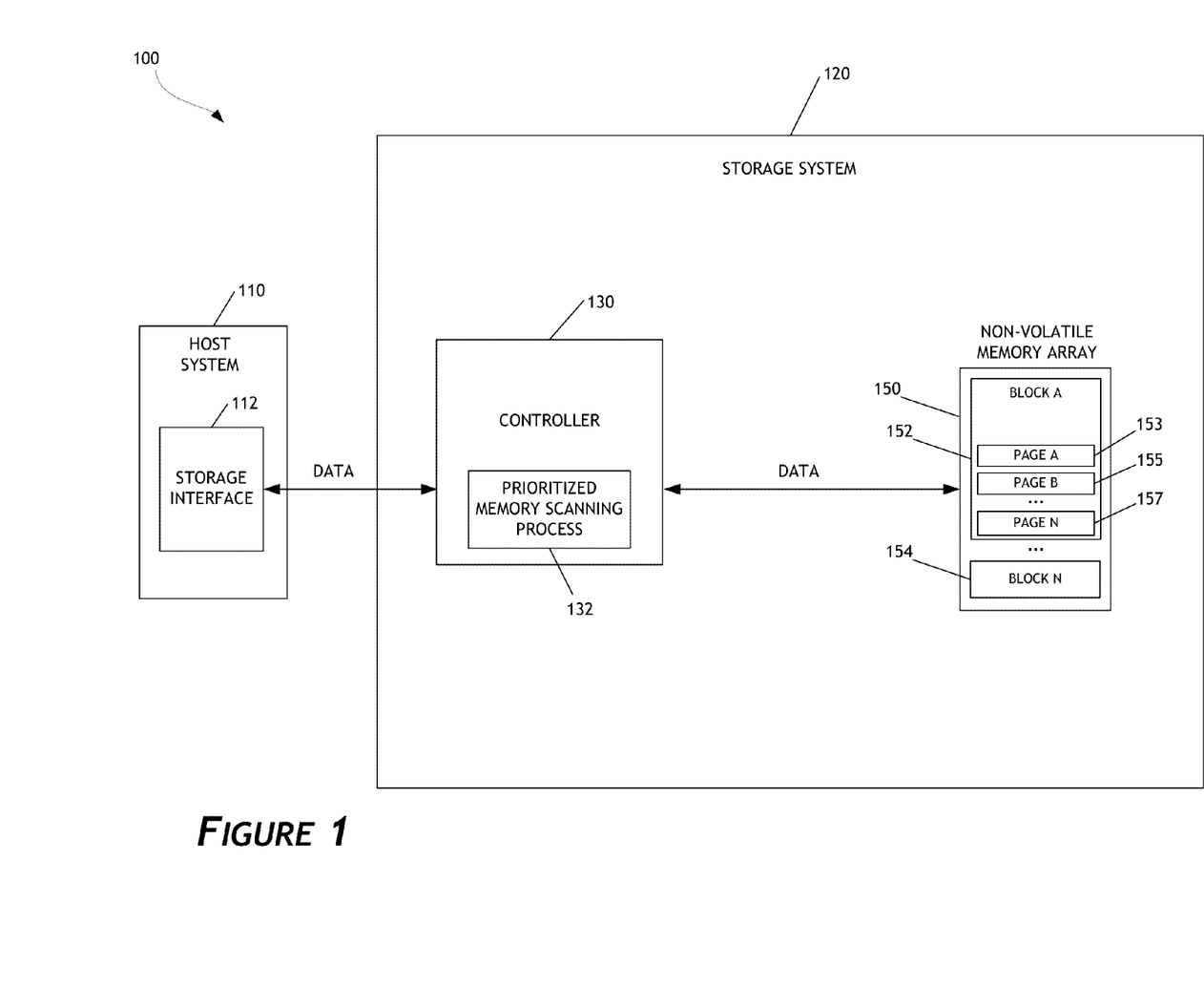
FIG. 1 illustrates a storage system that implements prioritized memory scanning according to one embodiment of the invention.

FIG. 1 illustrates a storage system 120 that implements prioritized memory scanning according to one embodiment of the invention. As is shown, a storage system 120 (e.g., hybrid hard drive, solid state drive, hard disk drive, etc.) includes a controller 130 and a non-volatile memory array 150, which comprises a one or more blocks of storage, identified as Block "A" (152) through Block "N" (154). Each block comprises a plurality of pages. For example, Block A (152) of FIG. 1 includes a plurality of pages, identified as Pages A (153), B (155), through N (157). The term "block" is used herein according to its broad and ordinary meaning, and reflects a smallest grouping of memory pages of the non-volatile memory array 150 or a smallest memory size which is erasable in a single operation or as a unit. The term "page" is used herein according to its broad and ordinary meaning, and reflects a smallest grouping of memory cells or a smallest memory size that can be programmed in a single operation or as a unit.

The controller 130 can be configured to receive data and/or storage access commands from a storage interface module 112 (e.g., a device driver) in a host system 110. Storage access commands communicated by the storage interface 112 can include write and read commands issued by the host system 110. Read and write commands can specify a logical block address in the storage system 120. The controller 130 can execute the received commands in the non-volatile memory array 150.

The controller 130 includes a prioritized memory scanning process module 132. The prioritized memory scanning process module 132 determines priorities of scanning pages of the non-volatile memory array 150 for memory errors and scans the non-volatile memory array 150 based on the determined priorities.

The non-volatile memory array 150 can be implemented using NAND flash memory devices. Other types of solid-state memory devices can alternatively be used, such as array of flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), Magnetoresistive RAM (MRAM), other discrete NVM (non-volatile memory) chips, or any combination thereof. In one embodiment, the non-volatile memory array 150 preferably includes multi-level cell (MLC) devices, although single-level cell (SLC) memory devices or a combination of SLC and MLC devices may be used.

Storage system 120 can store data communicated by the host system 110. That is, the storage system 120 can act as memory storage for the host system 110. To facilitate this function, the controller 130 can implement a logical interface. Logical interface can present to the host system 110 storage system memory as a set of logical addresses (e.g., contiguous address) where data can be stored. Internally, the controller 130 can map logical addresses to various physical memory addresses in the non-volatile memory array 150.

Prioritized Memory Scan

Figure 2:
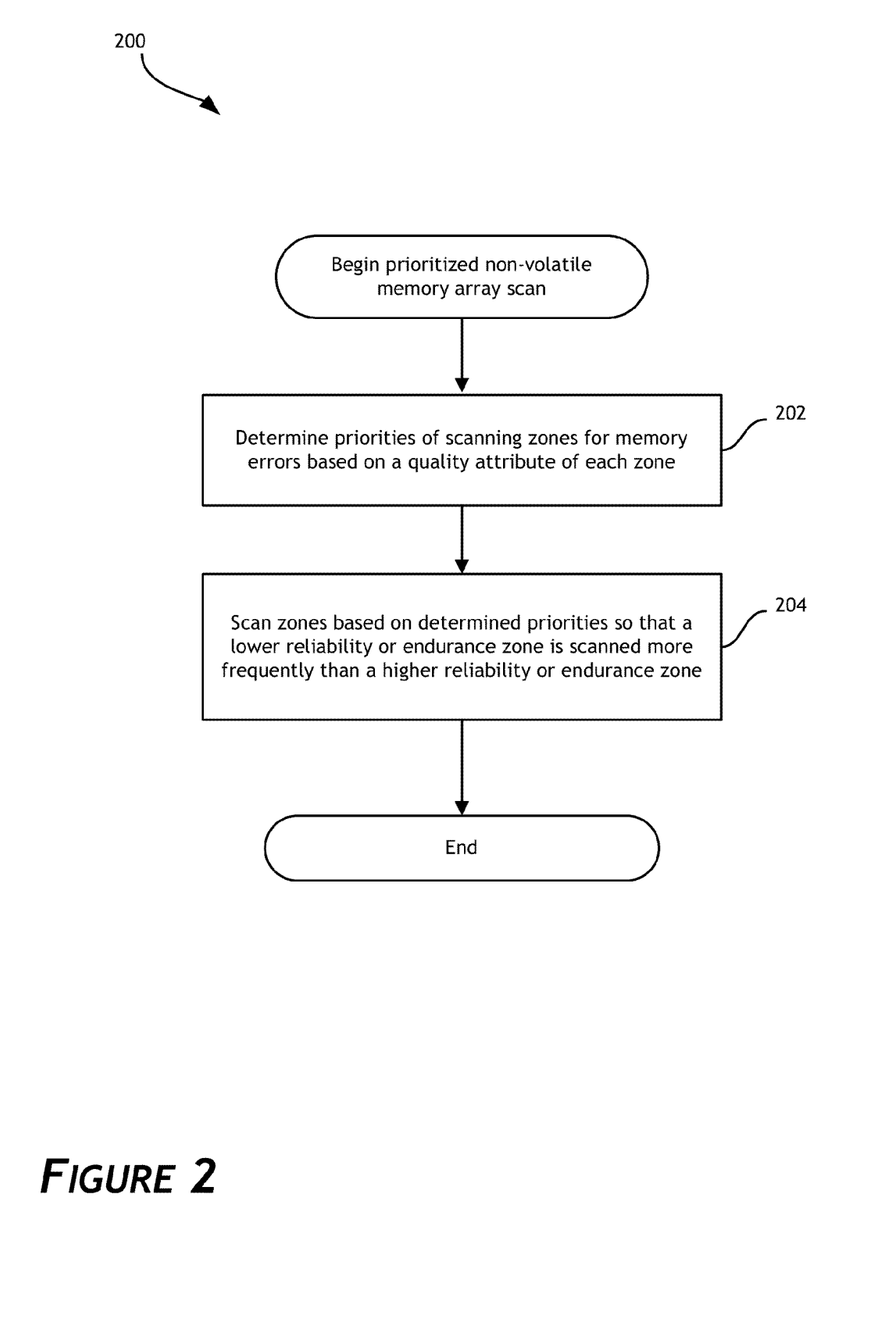
FIG. 2 is a flow diagram illustrating a process of prioritized scanning for memory errors according to one embodiment of the invention.

FIG. 2 is a flow diagram illustrating a process 200 of prioritized scanning for memory errors according to one embodiment of the invention. The process 200 can be executed by the controller 130 and/or the prioritized memory scanning process module 132. Advantageously, the process 200 enables earlier discovery of memory errors in the non-volatile memory array 150 than a sequential scan for memory errors.

At block 202, the priorities of scanning for memory errors are determined. The process 200, for example, can prioritize a scan of particular memory areas of the non-volatile memory array 150 over others for endurance-related or retention-related memory errors, such as raw bit errors. In one embodiment, the priorities of scanning can be based on a quality attribute of each page of the non-volatile memory array 150. In some embodiments, one or more pages of the non-volatile memory array 150 are further associated with or grouped into a plurality of zones of memory based on the quality attribute of the one or more pages and the plurality of zones (e.g., zones may include associations of series of contiguous pages within a block, associations of contiguous and non-contiguous pages within a block, or associations of pages across multiple blocks). Accordingly, a scan of pages or zones can be prioritized based on the quality attribute of the pages or zones.

The quality attribute of each page or zone can be a numerical value indicative of the reliability or endurance. The value, for instance, can reflect the quality of pages or zones relative to other pages or zones, or the value can reflect an absolute measurement of quality of pages or zones. In one embodiment, the quality attribute of a page is indicative of the quality of the page relative to other pages in the same block corresponding to the page.

Since a zone includes one or more pages, various approaches can be used to manage or determine the quality attribute of a zone. For example, the quality attribute of a zone can be based on the quality attribute of one or more selected or representative pages of the zone. As other examples, the quality attribute of a zone can be based on an average quality attribute, median, or a mean quality attribute of the one or more pages. In one embodiment, zones are assigned a quality attribute value selected from a range of quality attribute values, and pages are grouped into or associated with zones based on the assigned quality attribute value of each zone. For instance, if a quality attribute of a zone is one of four values, pages can be grouped into one of four zones based on the corresponding quality attributes of the pages, which can be averaged, medianed, etc. in the manner described above.

In one embodiment, the quality attribute is a 2-bit, four level value (e.g., 0, 1, 2, 3). A higher value reflects a lower quality and indicates that pages or zones are more likely to experience memory errors, such as endurance-related or retention-related memory errors (e.g., raw bit errors). In another embodiment, a higher value reflects lower likelihood that pages or zones will experience memory errors. In some embodiments, the quality attribute is a simple 1-bit flag or value with three or more bits. The number of bits of the quality attribute may increase or decrease based on a benefit of differentiating pages or zones and accounting for more factors in the quality attribute. As the number of bits increases, the granularity of the quality attribute and ability to differentiate pages according to likelihood of having memory errors also increases. In one embodiment, increasing such granularity also results in increasing the complexity of memory scanning.

A quality attribute of pages or zones can be based on a variety of factors. For instance, the quality attribute can be based on the physical location of pages or one or more pages of a zone. As discussed in this disclosure with respect to FIGS. 4, 5, and 6, pages are more or less likely to experience memory errors depending on the physical location of the pages in a block. As one example, when pages are located closer to a block boundary (e.g., a divide between one or more neighboring blocks of memory) than other pages of the same block, the pages closer to the block boundary reflect a lower level of reliability or endurance as the number of program-erase cycles increases.

As another example, a quality attribute of pages or zones can be based on an operational characteristic. As pages or zones experience use (e.g., storage or retrieval of data), non-use, or misuse, pages can become more likely to experience memory errors. For instance, when a number of program-erase cycles of pages or zones increases as data is written or programmed, the pages or zones incur wear and become more likely to experience memory errors. In one embodiment, program-erase cycle count can be maintained for blocks (e.g., block erase count), zones, and/or individual pages. Accordingly, increased usage (which can be reflected by increased block erase counts or program-erase cycles) of pages or zones can cause a decrease of the quality attributes (i.e., quality attributes that indicate a lower level or reliability or endurance). Further, frequent retrieval of data can cause a read disturb of neighboring pages and result in decreasing the quality attributes of the neighboring pages, which indicates a lower level or reliability or endurance. Additionally, a dwell time (e.g., time difference between consecutive erase operations) can affect the quality attributes. In particular, a shorter dwell time causes a decrease of the quality attributes since shorter time between erase operations can diminish retention and endurance. Other events, such as periodic refresh of data stored in the memory array, can affect the quality attributes.

As an additional example, a quality attribute of pages or zones can be based on a measured performance of pages and/or zones. For example, the measured performance can be reflected by a number of raw bit errors encountered when retrieving data or a number or amount of voltage threshold adjustments associated with retrieving data. A greater corresponding number of raw bit errors or number or amount of voltage threshold adjustments can reflect a degradation of endurance or reliability memory pages or zones and results in decreasing quality attributes. Another example is the number of errors encountered during programming of pages or zones, which can indicate a degradation of endurance or reliability.

As a further example, the quality attribute of pages or zones can be based on an environmental characteristic of pages or the non-volatile memory array 150. For instance, the environmental characteristic can depend on changes in temperature or humidity of the environment where non-volatile memory array 150 is being used. When the non-volatile memory array 150 operates in adverse conditions such as a high operating temperature, the likelihood of memory errors may increase. In one embodiment, the environmental characteristic may globally affect the quality attributes of all pages or zones of the non-volatile memory array. In other embodiments, the environmental characteristic may affect the quality attributes of some pages or zones of the non-volatile memory array but not other pages or zones.

In one embodiment, the quality attribute of pages or zones can reflect one of location, operational characteristic, measured performance, environmental characteristic, etc. In another embodiment, the quality attribute can reflect a combination of two or more of above characteristics. The quality attribute of pages or zones can be set or changed at various times. In one embodiment, initial values of quality attributes of pages and zones are set at manufacturing or when the storage system is initialized for the first time. The initial values are determined based on experimental determinations of a level of reliability or endurance of similar pages or zones configurations of other non-volatile memory arrays. The initial values are set or changed over the life of the non-volatile memory array 150 based on physical location of the pages and zones, operational characteristics, measured performances, environmental conditions, or determinations of the level of reliability of other non-volatile memory arrays.

With reference to FIG. 2, in one embodiment, using the quality attributes of zones, the process 200 evaluates the relative priority of scanning some zones for memory errors versus other zones. Based on the evaluated priorities of the zones, the process 200 determines how frequently some zones are scanned relative to other zones. For example, the process 200 determines that lower reliability or endurance zones are scanned more frequently than higher reliability or endurance zones.

In one embodiment, the process 200 evaluates the priority of scanning for memory errors versus other functions performed by the storage system 120 and/or controller 130. For instance, the process 200 can evaluate the quality attributes of zones and determine whether to perform a triggered scan for memory errors. The process 200 can be performed in the background (e.g., assigned lower priority than other tasks). However, when a particular triggering condition occurs, such as high environmental temperature or humidity, the process 200 can be assigned a higher priority. Alternatively, in addition to performing the scan in the background, the process 200 can perform a scan of selected pages or zones, which can be selected based on the quality attributes (e.g., n worst quality zones) or randomly (e.g., n randomly selected zones).

As another example of the step performed at block 202, the pages of each block (which includes 256 pages) are selected at manufacturing or initialization to correspond to one of three zones based on the physical location of the pages in blocks of the non-volatile memory array 150. Pages 0 to 71 are selected to correspond to zone 1, Pages 72 to 183 are selected to correspond to zone 2, and Pages 184 to 255 are selected to correspond to zone 3. An initial quality attribute of 0 (e.g., from a two-bit range of 0 to 3) is assigned to each zone. As raw bit errors are discovered in the zones or as the zones are subjected to more program-erase cycles, the quality attributes of the zones are adjusted higher to reflect a lower level of reliability or endurance. For instance, at the 15,000 program-erase cycle level, the quality attribute of zone 3 is incremented by one. At the 25,000 program-erase cycle level, the quality attribute of zones 2 and 3 are incremented by one. Further, when zone 3 experiences more raw bit errors than a threshold number of raw bit errors, the quality attribute of zone 3 is incremented by one. To determine scanning priorities of zones, the correspondence between quality attributes and scan frequencies is considered. For example, a zone with quality attribute of 1 is scanned 1.2 times as often as a zone with quality attribute of 0. A zone with quality attribute of 2 is scanned 1.5 times as often as a zone with quality attribute of 0. A zone with quality attribute of 3 is scanned 2.0 times as often as a zone with quality attribute of 0.

At block 204, zones are scanned based on the determined priorities of the zones. Zones having a lower reliability or endurance are scanned more frequently than higher reliability or endurance zones.

The scan process can detect, for example, errors that cannot be corrected by an error-correcting code (ECC) and correctable ECC errors that are close to the corrective capacity of ECC. The scan process disclosed herein allows for detection of errors that can be corrected. However, when an uncorrectable error is discovered, the process 200 can apply various approaches to attempt to recover data, such as adjusting the voltage thresholds. When a correctable error is discovered, the process 200 can detect the potential problem early before data becomes lost. Due to this, the process 200 may recover the data (as is described below) and thus may not need to perform ECC correction when servicing host reads, thereby improving the performance of the storage system 120.

The determined priorities can influence selection of a scheduling approach used in scanning the zones. For example, based on the determined priorities, the process 200 can select a scheduling approach that provides a scanning frequency consistent with the determined priorities while meeting certain requirements or providing other benefits. The process 200 can, for instance, select a weighted round-robin approach so that some zones are scanned more frequently than others while ensuring that all zones are scanned eventually. Further, the weighting of each zone can depend on or correspond to the quality attribute of each zone. In some embodiments, other scheduling approaches can be used such as basic priority based scheduling, prioritized shortest jobs first, prioritized first-in first-out, or prioritized multilevel queue scheduling.

In one embodiment, zones are scanned irrespective of the determined priorities. Such a scan can be particularly advantageous after a global event that may decrease the reliability or endurance of some zones of the non-volatile memory array 150. One such global event can be a high operating temperature or humidity, which can reduce the retention or endurance of memory array and increase the likelihood of memory errors. In some embodiments, the process 200 can periodically measure environmental conditions of the non-volatile memory array 150 and determine an environmental condition metric based on the measured environmental conditions.

Based on a comparison of the environmental condition metric to a threshold metric, the process 200 can selectively scan zones, as is explained above.

Figure 3:
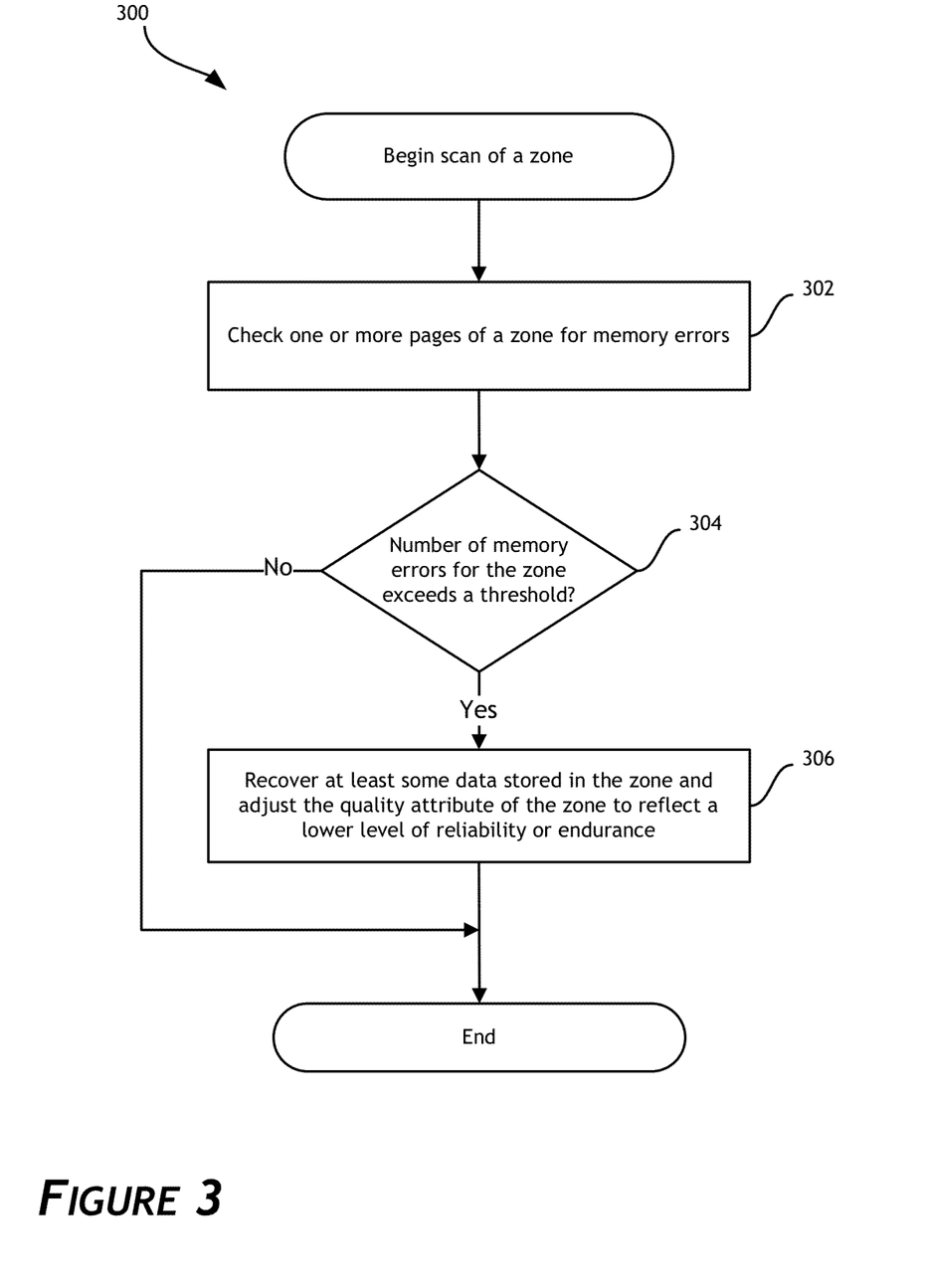
FIG. 3 is a flow diagram illustrating a process of scanning and data recovery according to one embodiment of the invention.

FIG. 3 is a flow diagram illustrating a process of scanning and data recovery according to one embodiment of the invention. The process 300 can be executed by the controller 130 and/or the prioritized memory scanning process module 132.

At block 302, one or more pages of a zone are checked for memory errors. The memory errors detected can include raw bit errors, programming errors, etc.

At block 304, a number of memory errors for the zone is compared to a threshold. In one embodiment, the process 300 sets the threshold based on an ECC threshold, such as setting the threshold equal to a percentage of the ECC threshold. For example, if the ECC threshold for a 4 KB page is 200 raw bit errors, the controller 130 can operate with a 30% margin relative to the ECC threshold and set the threshold equal to 120 raw bit errors for a 4 KB page. If the number of memory errors for the zone does not exceed the threshold, the scan of the zone is complete. On the other hand, if the number of memory errors for the zone exceeds the threshold, the process 300 moves to block 306.

At block 306, all or at least some data stored in the zone is recovered, and the quality attribute of the zone is adjusted to reflect a lower level of reliability or endurance. Recovered data can be reprogrammed into the same zone or another zone. Advantageously, recovering data in the zone can enable earlier discovery of memory errors and earlier recovery of stored data before the data is permanently lost. Moreover, stored data can be recovered ahead of read operation received from the host system 110, so that retrieval of data in response to the read operation is not be slowed by the recovery process.

Figure 4:
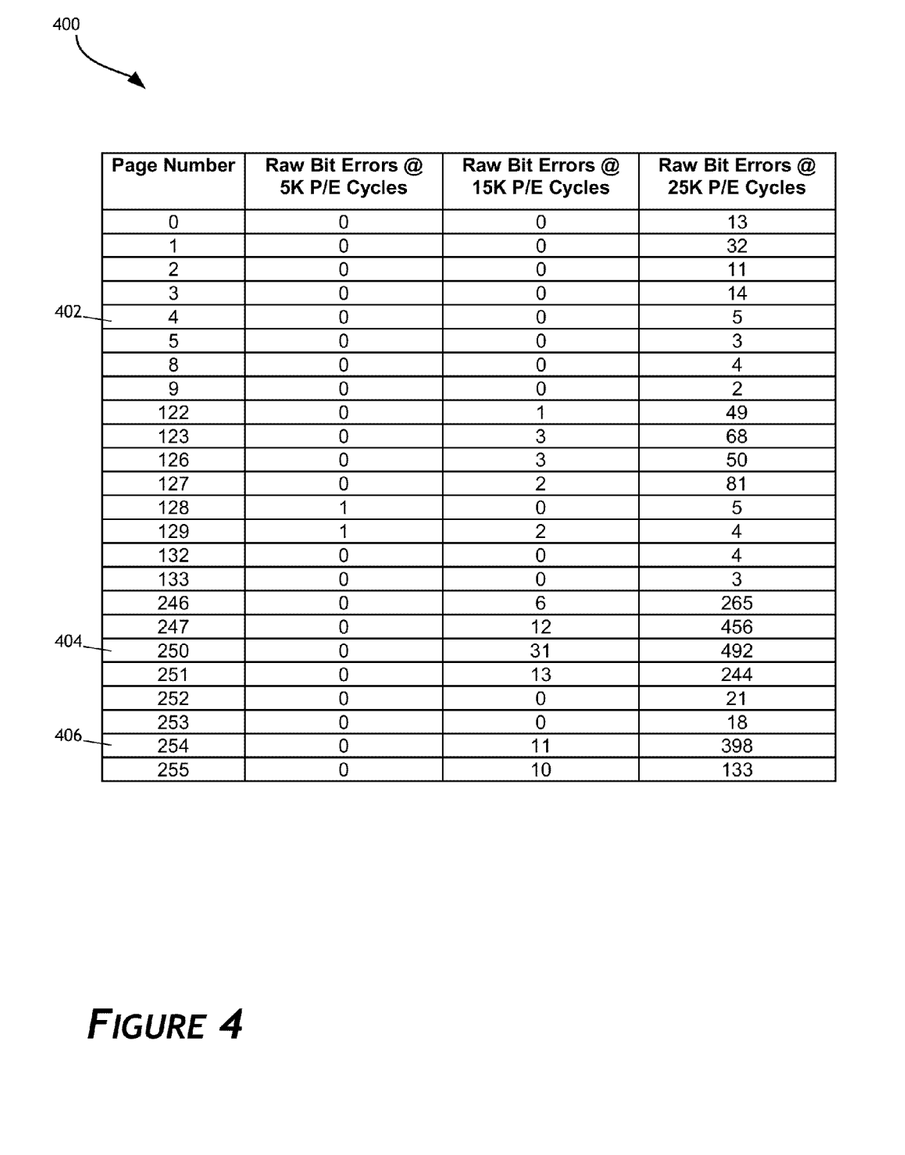
FIG. 4 is a table listing the number of raw bit errors for particular pages of a block at various program-erase cycle levels according to one embodiment of the invention.

FIG. 4 is a table listing the number of raw bit errors at various program-erase cycle levels according to one embodiment of the invention. The table 400 lists raw bit errors for particular pages of an example block of MLC NAND flash memory. The example block includes 256 pages although values are shown only for 26 particular pages. The raw bit errors listed in the table are one example of a memory error discussed in this disclosure. Each number of raw bit errors provides an indication of the quality of particular pages at various program-erase cycle levels. As is illustrated by FIG. 4, some pages of memory wear more quickly than other pages as pages are used (e.g., as the program-erase cycle level increases).

At row 402, the numbers of raw bit errors for Page 4 are listed at the 5,000, 15,000, and 25,000 program-erase cycle levels. According to the table, Page 4 experienced zero raw bit errors at both the 5,000 and 15,000 program-erase cycle levels. Page 4, however, experienced 5 raw bit errors at the 25,000 program-erase cycle level.

At row 404, the numbers of raw bit errors for Page 250 are also listed at the 5,000, 15,000, and 25,000 program-erase cycle levels. According to the table, Page 250 experienced zero raw bit errors at the 5,000 program-erase cycle level and 31 raw bit errors at the 10,000 program-erase cycle level. Page 250 experienced 492 raw bit errors at the 25,000 program-erase cycle level.

At row 406, the numbers of raw bit errors for Page 254 are listed at the 5,000, 15,000, and 25,000 program-erase cycle levels. According to the table, Page 254 experienced zero raw bit errors at the 5,000 program-erase cycle level and 11 raw bit errors at the 10,000 program-erase cycle level. Page 254 experienced 398 raw bit errors at the 25,000 program-erase cycle level.

Pages 4, 250, and 254 experienced a similar, small number of raw bit errors at the 5,000 program-erase cycle level (i.e., zero raw bit errors for each page), suggesting a comparable quality level of the pages at the 5,000 program-erase cycle level. However, Pages 4, 250, and 254 experienced an increasingly disparate number of raw bit errors at the 15,000 and 25,000 program-erase cycle levels, suggesting different quality levels of the pages at the higher program-erase cycle levels. In particular, the disparate quality levels correspond to the physical locations of pages in the block such that when pages are located closer to the block boundary (e.g., a divide between one or more neighboring blocks) than other pages of the block, the pages closer to the block boundary reflect a lower level of reliability or endurance as the number of program-erase cycles increases. Accordingly, pages located closer to the block boundary (e.g., higher numbered pages) can advantageously be scanned for memory errors more frequently than other pages since at least some of these pages are more likely to reflect a lower level of reliability or endurance. Pages located closer to the block boundary can be grouped into a zone that is assigned a quality attribute which indicates lower reliability or endurance.

Figure 5:
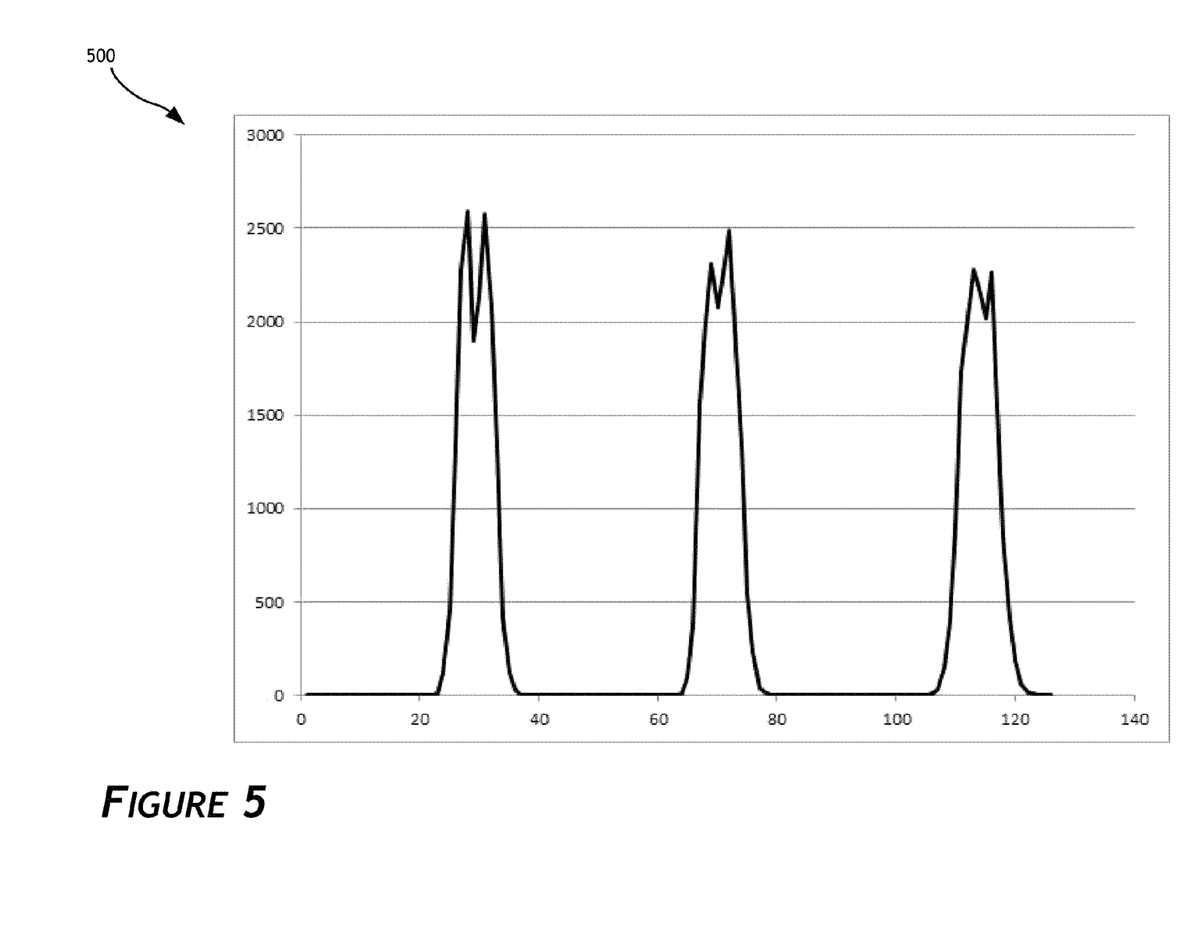
FIG. 5 is a graph illustrating the voltage threshold distribution of memory cells of a page at a given program-erase cycle level according to one embodiment of the invention.

FIG. 5 is a graph illustrating the voltage threshold distribution of memory cells of a page at a given program-erase cycle level according to one embodiment of the invention. Graph 500 illustrates voltage threshold distribution of memory cells of a page at 1,000 program-erase cycle level in MLC NAND flash memory after random data patterns have been programmed. The x-axis is a voltage code axis corresponding to voltage level. The y-axis corresponds to a probability distribution of cells in the page. As can be seen in the graph, the voltage threshold distribution of cells form relatively defined, narrow, and separated peaks at three approximate voltage reference levels, suggesting a generally higher quality and level of reliability or endurance of the page.

Figure 6:
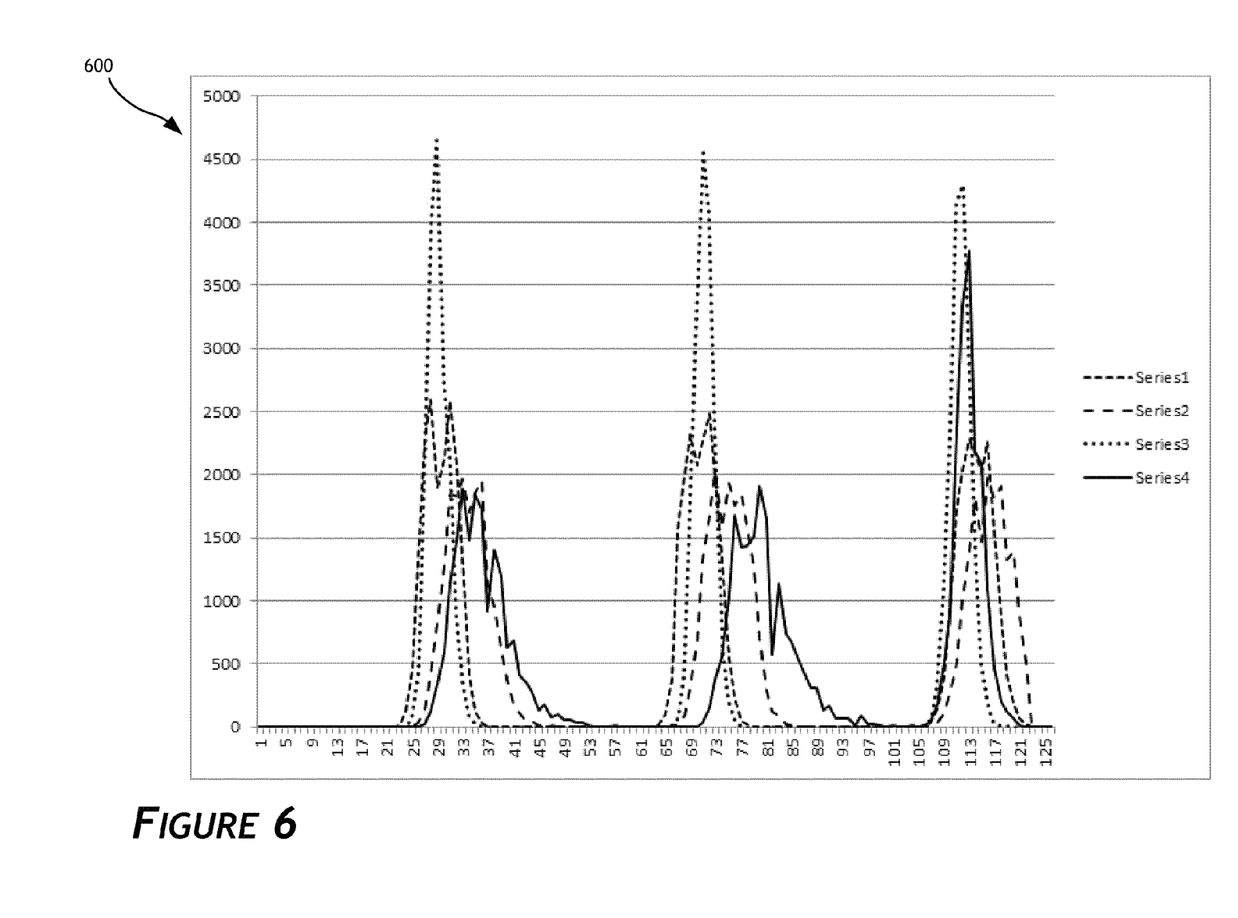
FIG. 6 is a graph illustrating the voltage threshold distribution of memory cells of two pages of a block at two different program-erase cycle levels according to one embodiment of the invention.

FIG. 6 is a graph illustrating the voltage threshold distribution of memory cells of two pages of an example block at two different program-erase cycle levels according to one embodiment of the invention. Graph 600 illustrates voltage threshold distribution of memory cells of two pages in MLC NAND flash memory after random data patterns have been programmed. The x-axis is a voltage code axis corresponding to voltage level. The y-axis corresponds to a probability distribution of cells in the page. Series 1 and 3 illustrate Page 0 of the block at the 1,000 and 30,000 program-erase cycle levels, respectively. Series 2 and 4 illustrate Page 250 of the block at the 1,000 and 30,000 program-erase cycle levels, respectively. In one embodiment, same random data patterns have been written to Pages 0 and 250. In another embodiment, different random data patterns have been written to Pages 0 and 250.

As can be seen from Series 1 and 2, the voltage threshold distribution of cells for Pages 0 and 250 form relatively defined, narrow, and separated peaks at three approximate voltage reference levels at the 1,000 program-erase cycle level. This indicates a generally higher quality and level of reliability or endurance for the Pages 0 and 250 since these voltage threshold levels allow for further adjustment to when retrieving data, among other reasons. However, as can be seen from Series 3 and 4, the peaks of the voltage threshold distributions of Pages 0 and 250 widen and shorten at the 30,000 program-erase cycle level, indicating a generally diminishing quality and level of reliability or endurance of the cells. In particular, the peaks of Series 4 shows greater widening and shortening than the peaks of Series 3, which indicates that Page 250 demonstrates a lower quality and level of reliability or endurance than Page 0.

Other Variations

Those skilled in the art will appreciate that in some embodiments, other types of scheduling approaches or quality attribute factors can be used in the prioritized scan of the non-volatile memory array 150. Further, the prioritized scan disclosed herein can be combined with other memory scanning procedures, such as sequential scan (which can be performed in the background). Additional system components can be utilized, and disclosed system components can be combined or omitted. For example, the host system 110 can be configured to assist in the management or implementation of the prioritized scan for memory errors. In addition, the actual steps taken in the disclosed processes, such as the process illustrated in FIGS. 2 and 3, may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system, comprising:
a solid-state non-volatile memory array comprising blocks including a block and a neighboring block, the block associated with a plurality of zones including a first zone and a second zone, each zone of the plurality of zones including one or more pages of the block; and
a controller configured to:
write data to, and read the data from, the memory array in response to memory access commands received from a host system; and
scan the memory array for memory errors with (1) a scan frequency of the one or more pages of the first zone depending at least on a position of a page of the first zone within the block relative to a physical block boundary separating the block from the neighboring block and (2) a scan frequency of the one or more pages of the second zone depending at least on a position of a page of the second zone within the block relative to the physical block boundary,
wherein the position of the page in the first zone is located closer to the physical block boundary than the position of the page in the second zone, and the controller is configured to scan the one or more pages of the first zone for the memory errors more frequently than the one or more pages of the second zone.

2. The data storage system of claim 1, wherein the memory errors comprise endurance-related memory errors, and the first zone comprises a first group of contiguous pages of the block and the second zone comprises a second group of contiguous pages of the block not overlapping with the first group of contiguous pages.

3. The data storage system of claim 1, wherein the block has a block size equal to a size of a smallest grouping of pages of the memory array which is erasable in a single operation by the controller.

4. The data storage system of claim 1, wherein the neighboring block is a subsequent neighboring block to the block.

5. In a data storage subsystem comprising a controller and a non-volatile memory array comprising a plurality of blocks, each block of the plurality of blocks comprising a plurality of pages, a method of scanning for memory errors of the non-volatile memory array, the method comprising:
determining priorities for scanning a plurality of zones of a block of the plurality of blocks for the memory errors based at least in part on a quality attribute of each zone of the plurality of zones, each zone of the plurality of zones comprising one or more pages of the block; and
scanning the one or more pages of the plurality of zones for the memory errors based on the determined priorities so that the one or more pages of a first zone of the plurality of zones comprising a first quality attribute are scanned more frequently than the one or more pages of a second zone of the plurality of zones comprising a second quality attribute,
wherein the first quality attribute depends at least on a physical position of a page of the first zone within the block, and the second quality attribute depends at least on a physical position of a page of the second zone within the block.

6. The method of claim 5, wherein said scanning the one or more pages of the plurality of zones comprises:
checking the one or more pages of the first zone for the memory errors;
determining whether a count of the memory errors for the first zone exceeds a threshold; and
when the count of the memory errors for the first zone exceeds the threshold, recovering at least some data stored in the one or more pages of the first zone and adjusting the first quality attribute to reflect a lower level of reliability or endurance.

7. The method of claim 5, wherein the first quality attribute further depends at least on one of: an operational characteristic of the one or more pages of the first zone, a measured performance of the one or more pages of the first zone, and an environmental characteristic of the non-volatile memory array.

8. The method of claim 5, wherein the first quality attribute further depends at least on a number of program-erase cycles performed on the one or more pages in the first zone.

9. The method of claim 5, wherein said determining the priorities for scanning comprises determining the priorities using a weighted round robin scheduling based at least in part on the quality attribute of each zone.

10. The method of claim 5, further comprising:
periodically measuring environmental conditions of the non-volatile memory array;
determining an environmental condition metric based on the measured environmental conditions; and
based on a comparison of the environmental condition metric to a threshold metric:
   randomly selecting a set of zones from the plurality of zones irrespective of the determined priorities; and
   scanning the one or more pages of the set of zones for the memory errors.

11. The method of claim 5, wherein the first zone comprises a first group of contiguous pages of the block, and the second zone comprises a second group of contiguous pages of the block not overlapping with the first group of contiguous pages.

12. The method of claim 5, wherein the first quality attribute depends at least on the physical position of the page of the first zone within the block with respect to a physical block boundary separating the block from a subsequent neighboring block, and the second quality attribute depends at least on the physical position of the page of the second zone within the block with respect to the physical block boundary.

13. A data storage subsystem comprising a controller configured to communicate with a non-volatile memory array comprising a plurality of blocks, each block of the plurality of blocks comprising a plurality of pages,
wherein the controller is configured to:
   determine priorities for scanning a plurality of zones of a block of the plurality of blocks for memory errors based at least in part on a quality attribute of each zone, each zone of the plurality of zones comprising one or more pages of the block; and
   scan the one or more pages of the plurality of zones for the memory errors based on the determined priorities so that the one or more pages of a first zone of the plurality of zones comprising a first quality attribute are scanned more frequently than the one or more pages of a second zone of the plurality of zones comprising a second quality attribute, and
wherein the first quality attribute depends at least on a physical position of a page of the first zone within the block, and the second quality attribute depends at least on a physical position of a page of the second zone within the block.

14. The data storage subsystem of claim 13, wherein when the controller scans the first zone, the controller is configured to:
   check the one or more pages of the first zone for the memory errors;
   determine whether a count of the memory errors for the first zone exceeds a threshold; and
   when the count of the memory errors for the first zone exceeds the threshold, recover at least some data stored in the first zone and adjust the first quality attribute to reflect a lower level of reliability or endurance.

15. The data storage subsystem of claim 13, wherein the first quality attribute further depends at least on one of: an operational characteristic of the one or more pages of the first zone, a measured performance of the one or more pages of the first zone, and an environmental characteristic of the non-volatile memory array.

16. The data storage subsystem of claim 13, wherein the first quality attribute further depends at least on a number of program-erase cycles performed on one or more pages in the first zone.

17. The data storage subsystem of claim 13, wherein the controller is further configured to determine priorities for scanning using a weighted round robin scheduling based at least in part on the quality attribute of each zone.

18. The data storage subsystem of claim 13, wherein the controller is further configured to:
   periodically measure environmental conditions of the non-volatile memory array;
   determine an environmental condition metric based on the measured environmental conditions; and
   based on a comparison of the environmental condition metric to a threshold metric:
      randomly select a set of zones from the plurality of zones; and
      scan the one or more pages of the set of zones for the memory errors.

19. The data storage subsystem of claim 13, wherein the first zone comprises a first group of contiguous pages of the block, and the second zone comprises a second group of contiguous pages of the block not overlapping with the first group of contiguous pages.

20. The data storage subsystem of claim 13, wherein the first quality attribute depends at least on the physical position of the page of the first zone within the block with respect to a physical block boundary separating the block from a subsequent neighboring block, and the second quality attribute depends at least on the physical position of the page of the second zone within the block with respect to the physical block boundary.

* * * * *